(12) United States Patent
Hakko et al.

(10) Patent No.: US 8,163,448 B2
(45) Date of Patent: Apr. 24, 2012

(54) DETERMINATION METHOD, EXPOSURE METHOD, DEVICE FABRICATION METHOD, AND STORAGE MEDIUM

(75) Inventors: Manabu Hakko, Utsunomiya (JP); Kenji Yamazoe, Berkeley, CA (US)

(73) Assignee: Canon Kabushiki Kaisha (JP)

( * ) Notice: Subject to any disclaimer, the term of this patent is extended or adjusted under 35 U.S.C. 154(b) by 314 days.

(21) Appl. No.: 12/685,368

(22) Filed: Jan. 11, 2010

(65) Prior Publication Data

US 2010/0178621 A1 Jul. 15, 2010

(30) Foreign Application Priority Data

Jan. 15, 2009 (JP) .................................. 2009-006896

(51) Int. Cl.
*G03F 9/00* (2006.01)
*G03C 5/00* (2006.01)

(52) U.S. Cl. .................................. 430/30; 430/4; 716/53

(58) Field of Classification Search ................ 430/5, 30; 716/53
See application file for complete search history.

(56) References Cited

U.S. PATENT DOCUMENTS

| 7,506,299 B2 | 3/2009 | Socha et al. |
| 7,594,199 B2 | 9/2009 | Socha et al. |
| 2008/0052334 A1 | 2/2008 | Yamazoe |

FOREIGN PATENT DOCUMENTS

| JP | 2004-221594 A | 8/2004 |
| JP | 2006-073709 A | 3/2006 |
| JP | 2008-040470 A | 2/2008 |

*Primary Examiner* — Christopher Young
(74) *Attorney, Agent, or Firm* — Rossi, Kimms & McDowell LLP

(57) ABSTRACT

The present invention provides a method of determining a structure of an antireflection coating formed on a substrate as an exposure target of an exposure apparatus, the method comprising steps of calculating, an intensity distribution of light diffracted by an original, based on information of an effective light source formed on a pupil plane of a projection optical system, and information of an original pattern, extracting diffracted light having an intensity of not less than a threshold from the intensity distribution calculated in the calculating step, and determining the structure of the antireflection coating, formed on the substrate, such that a reflectance of the antireflection coating falls within a target range when an incident angle of the diffracted light, which has the intensity of not less than the threshold and is extracted in the extracting step, on the antireflection coating formed on the substrate is an input.

12 Claims, 9 Drawing Sheets

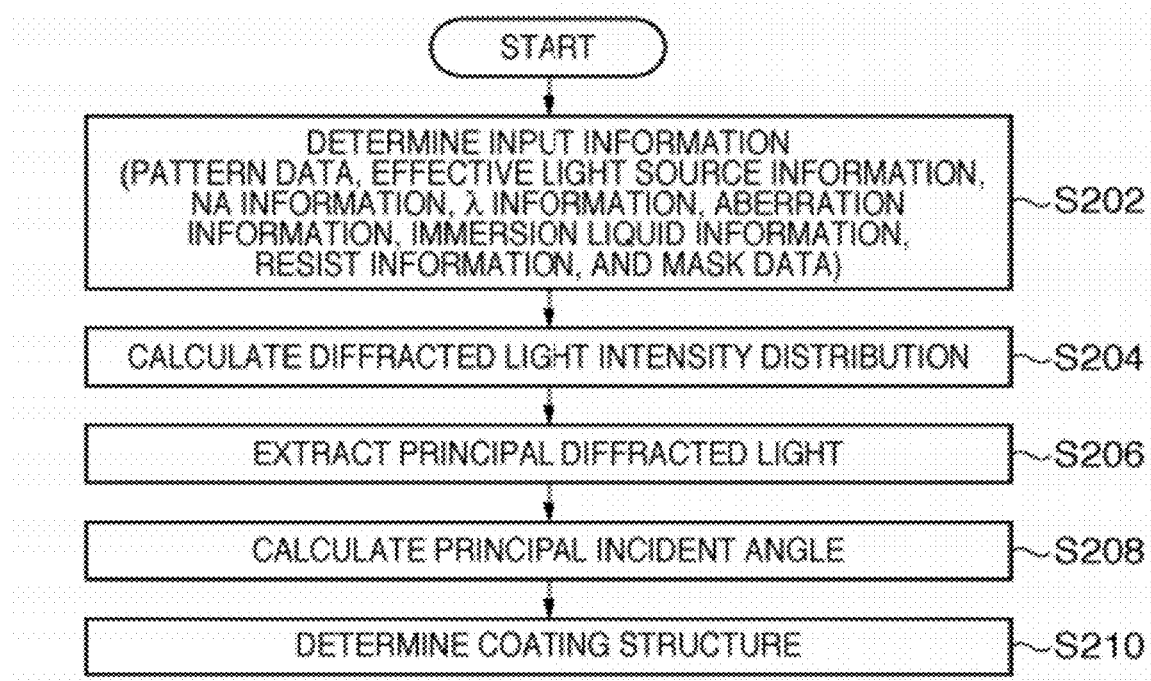
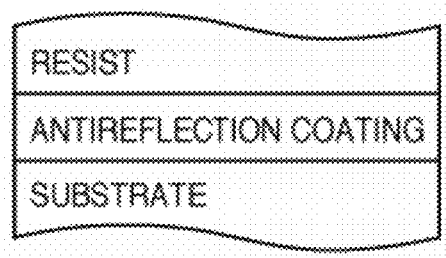

F I G. 12A
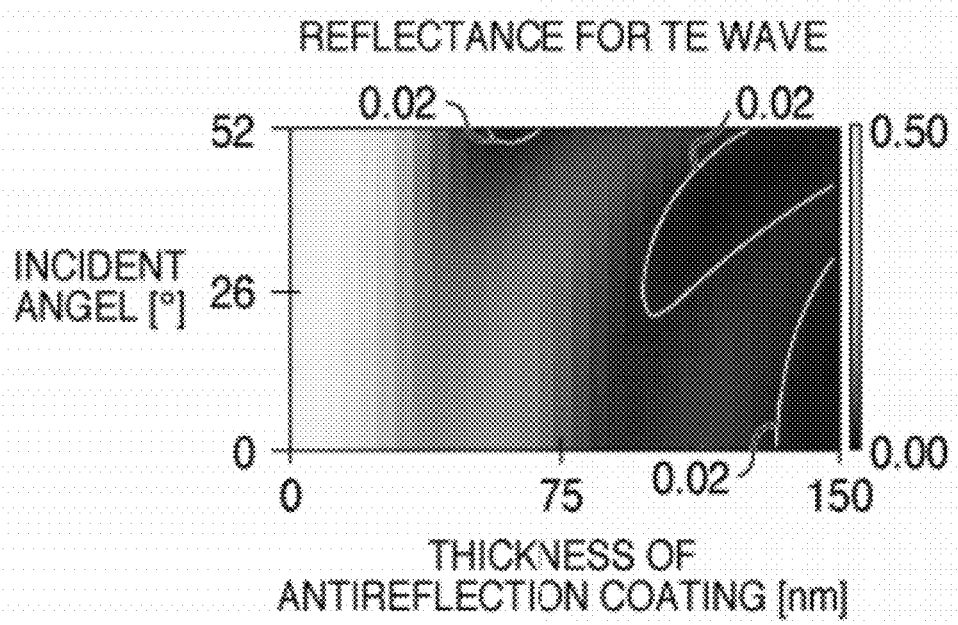
F I G. 12B
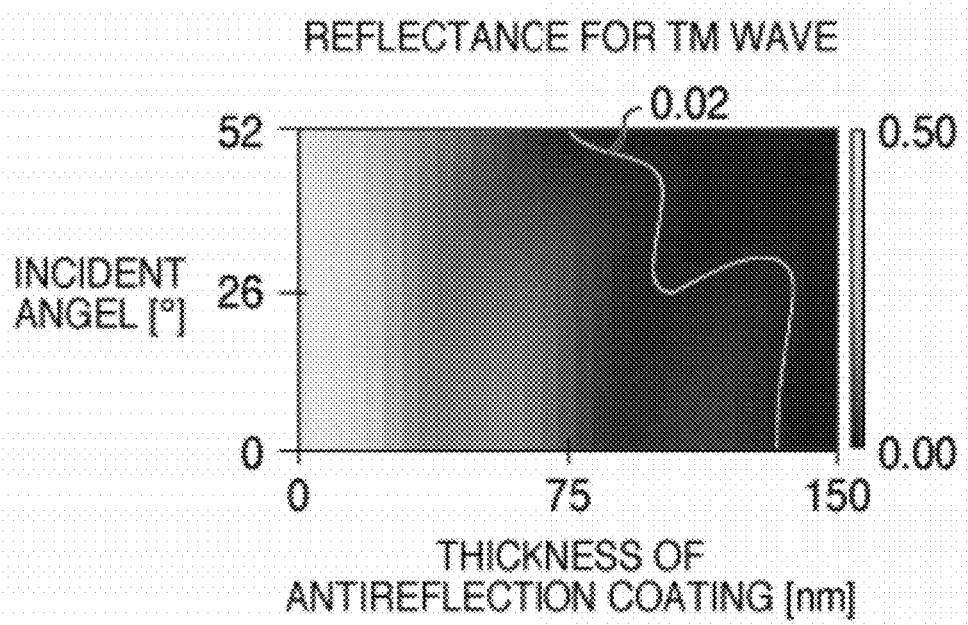

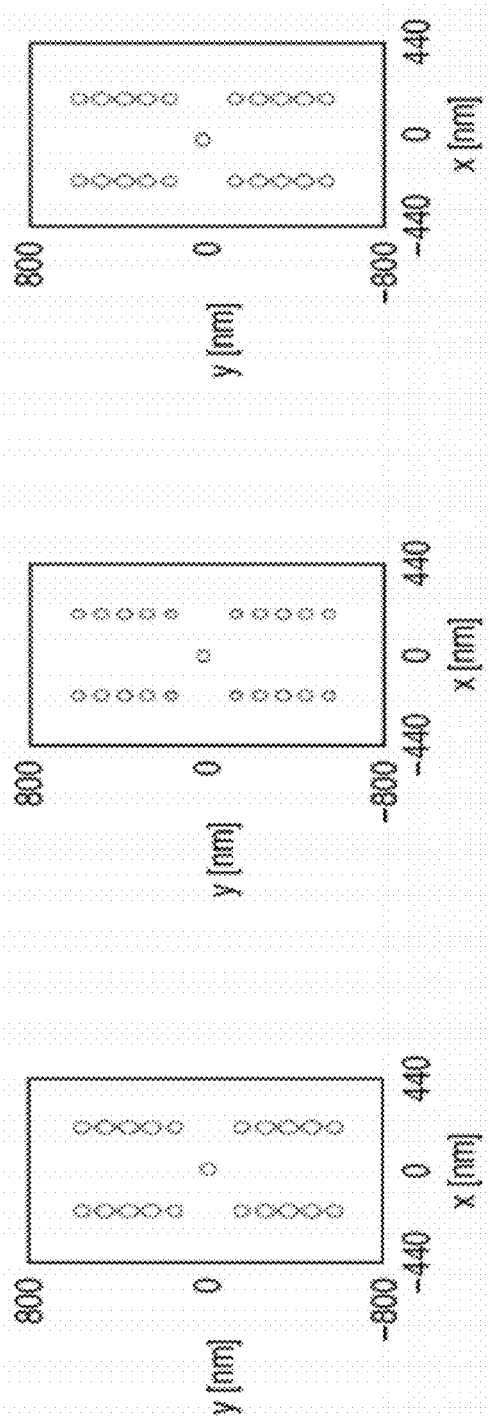

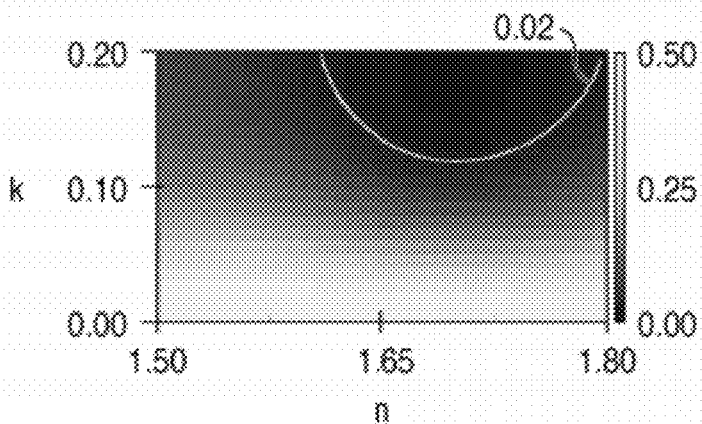
FIG. 14A
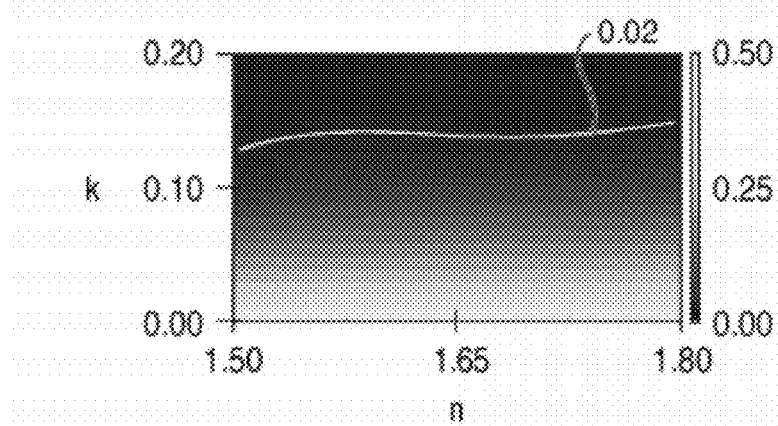
FIG. 14B
FIG. 15
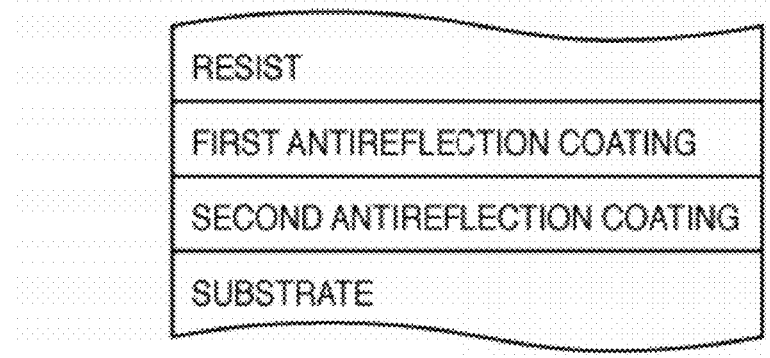

DETERMINATION METHOD, EXPOSURE METHOD, DEVICE FABRICATION METHOD, AND STORAGE MEDIUM

BACKGROUND OF THE INVENTION

1. Field of the Invention

The present invention relates to a determination method, an exposure method, a device fabrication method, and a storage medium.

2. Description of the Related Art

An exposure apparatus is employed to fabricate semiconductor devices such as a semiconductor memory and a logic circuit using photolithography. The exposure apparatus projects and transfers a pattern formed on an original (a mask or a reticle) onto a substrate such as a wafer by a projection optical system. To keep up with the recent advances in micropatterning of semiconductor devices, the projection exposure apparatus is required to further improve its resolution (achieve a higher resolution).

Known means for achieving a higher resolution of a projection exposure apparatus are attainment of a higher NA of a projection optical system (an increase in numerical aperture (NA) of the projection optical system), and shortening of the wavelength of exposure light. In addition, nowadays, attainment of a higher NA of a projection optical system by an immersion technique is attracting a great deal of attention. The immersion technique fills the space between a substrate and the final lens (final surface) of a projection optical system with a liquid having a refractive index of 1 or more to increase the NA of the projection optical system in proportion to the refractive index of the liquid. The immersion technique also has the effect of narrowing the incident angle of light which enters a photosensitive agent applied on a substrate to increase the depth of focus in resolution at the same NA.

At the same time, as the NA of a projection optical system increases, it is often the case that light having a wider incident angle enters a substrate (a photosensitive agent (resist) applied on the substrate). This makes it necessary to take account of the incident angle of incident light on the photosensitive agent and the substrate in designing an antireflection coating formed between them. Under the circumstance, Japanese Patent Laid-Open No. 2006-73709 proposes a technique of designing an antireflection coating so as to have low reflectances over the entire incident angle range of light which reaches the photosensitive agent.

Unfortunately, the conventional design of an antireflection coating does not take account of the intensity distribution of light diffracted by an original. This makes it impossible to optimize the structure of the antireflection coating for light beams which have intensities equal to or higher than a threshold in the intensity distribution and therefore mainly contribute to imaging. Thus, an antireflection coating formed based on its conventional design often has a high reflectance for light that mainly contributes to imaging, resulting in degradation in imaging performance.

SUMMARY OF THE INVENTION

The present invention provides a technique that can determine a coating structure, which reduces degradation in imaging performance attributed to an antireflection coating formed on a substrate, in designing the antireflection coating.

According to one aspect of the present invention, there is provided a storage medium storing a program for causing a computer to execute a method of determining a structure of an antireflection coating formed on a substrate as an exposure target of an exposure apparatus including an illumination optical system which illuminates an original with light from a light source and a projection optical system which projects a pattern of the original, the program causing the computer to execute steps of calculating, an intensity distribution of light diffracted by the original illuminated by the illumination optical system, based on information of an effective light source formed on a pupil plane of the projection optical system when the original is not located on an object plane of the projection optical system, and information of an original pattern including a main pattern corresponding to a target pattern to be formed on the substrate and an assist pattern, extracting diffracted light having an intensity of not less than a threshold from the intensity distribution calculated in the calculating step, and determining the structure of the antireflection coating, formed on the substrate, such that a reflectance of the antireflection coating falls within a target range when an incident angle of the diffracted light, which has the intensity of not less than the threshold and is extracted in the extracting step, on the antireflection coating formed on the substrate is an input.

Further features of the present invention will become apparent from the following description of exemplary embodiments with reference to the attached drawings.

BRIEF DESCRIPTION OF THE DRAWINGS

FIG. 2 is a flowchart for explaining a process of generating coating structure data by executing a coating structure determination program by a control unit of the processing apparatus shown in FIG. 1.

FIG. 3 is a schematic sectional view showing the positional relationship among an antireflection coating, a resist, and a substrate.

FIGS. 12A and 12B are charts showing the reflectances of the antireflection coating when its thickness and the light incident angle on it are changed.

FIGS. 13A to 13F are views showing the imaging performances when the antireflection coating has a thickness of 95 nm, 110 nm, or 150 nm.

FIGS. 14A and 14B are charts showing the reflectances of the antireflection coating when its refractive index n (absorption coefficient k) is changed.

FIG. 15 is a schematic sectional view showing the positional relationship among an antireflection coating, a resist, and a substrate.

DESCRIPTION OF THE EMBODIMENTS

Figure 1:
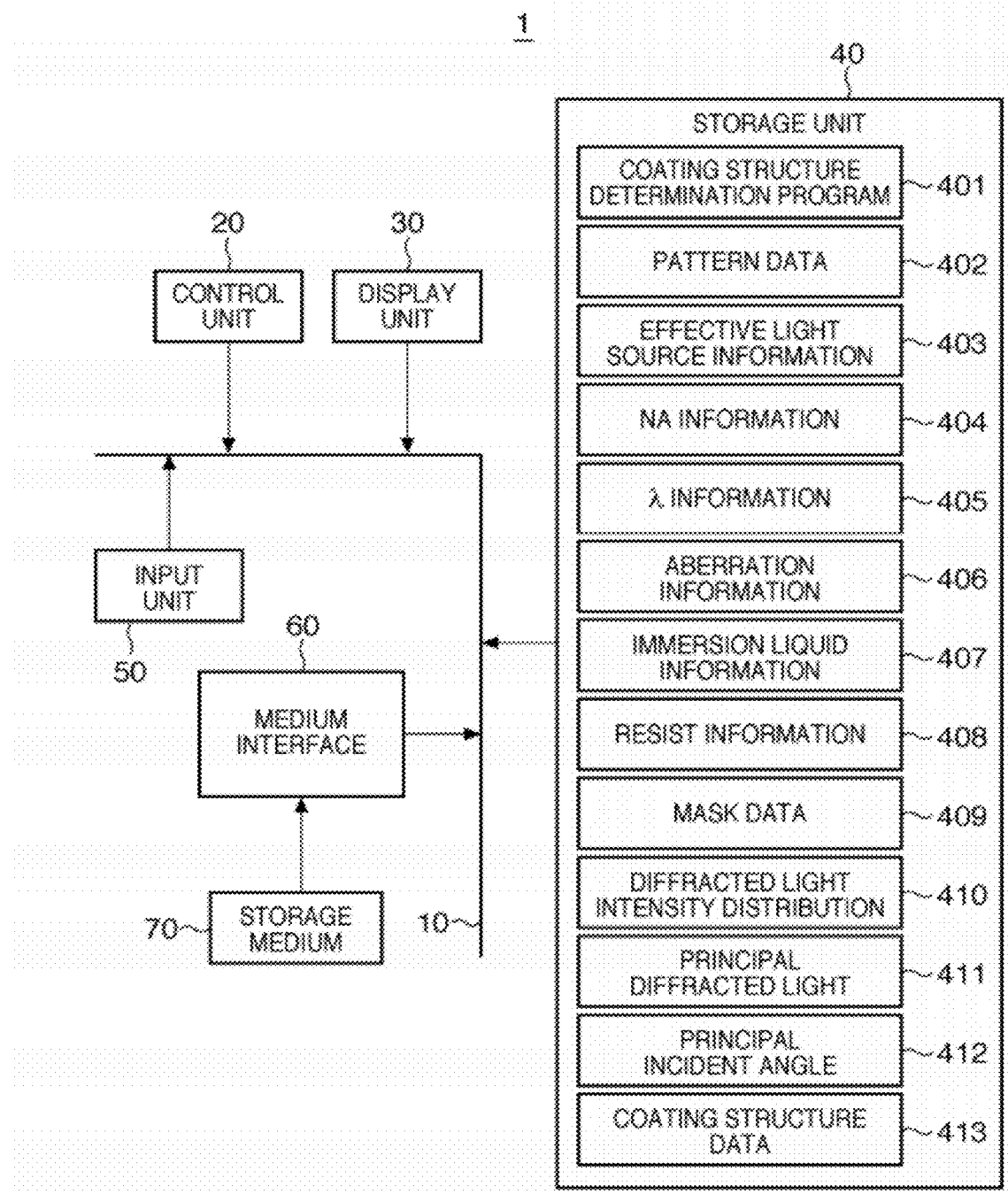
FIG. 1 is a schematic block diagram showing the arrangement of a processing apparatus which performs a determination method according to one aspect of the present invention.

Preferred embodiments of the present invention will be described below with reference to the accompanying drawings. Note that the same reference numerals denote the same members throughout the drawings, and a repetitive description thereof will not be given.

The present invention is applicable to design of an antireflection coating formed on a substrate as the exposure target of an exposure apparatus employed to fabricate, for example, semiconductor devices such as an IC and an LSI. The present invention is suitable for determining the structure of an antireflection coating formed on a substrate as the exposure target of, for example, an immersion exposure apparatus in which the space between the substrate and the final lens (final surface) of a projection optical system is filled with a liquid (immersion liquid).

The concept disclosed in the present invention can be modeled mathematically. Hence, the present invention can be implemented as a software function of a computer system. A software function of a computer system includes programming including executable software codes, and can determine a coating structure which reduces degradation in imaging performance attributed to an antireflection coating in this embodiment. The software codes are executed by a processor of the computer system. Codes or associated data records are stored in a computer platform during the software code operation. However, the software codes are often stored in other sites or loaded into an appropriate computer system. For this reason, the software codes can be held on a computer-readable recording medium as one or a plurality of modules. The present invention can be described in the form of the above-mentioned codes, and can function as one or a plurality of software products.

FIG. 1 is a schematic block diagram showing the arrangement of a processing apparatus 1 which performs a determination method according to one aspect of the present invention. This determination method determines the structure of an antireflection coating formed on a substrate as the exposure target of an exposure apparatus including an illumination optical system which illuminates an original (mask) with light from a light source, and a projection optical system which projects the pattern of the original.

The processing apparatus 1 is, for example, a general-purpose computer and includes a bus line 10, control unit 20, display unit 30, storage unit 40, input unit 50, and medium interface 60, as shown in FIG. 1.

The bus line 10 connects the control unit 20, display unit 30, storage unit 40, input unit 50, and medium interface 60 to each other.

The control unit 20 is a CPU, a GPU, a DSP, or a microcomputer and includes, for example, a cache memory for temporary storage. The control unit 20 starts up and executes a coating structure determination program 401 stored in the storage unit 40, based on a startup command for the coating structure determination program 401, which is input by the user via the input unit 50. The control unit 20 performs an arithmetic operation, associated with determination of the structure of the antireflection coating, using the data stored in the storage unit 40.

The display unit 30 is, for example, a display device such as a CRT display or a liquid crystal display. The display unit 30 displays, for example, information (for example, a diffracted light intensity distribution 410 and coating structure data 413 (both will be described later) concerning execution of the coating structure determination program 401.

The storage unit 40 is, for example, a memory or a hard disk. The storage unit 40 stores the coating structure determination program 401 provided from a storage medium 70 connected to the medium interface 60. The storage unit 40 stores pattern data 402, effective light source information 403, NA information 404, λ information 405, aberration information 406, immersion liquid information 407, resist information 408, and mask data 409 as information input prior to execution of the coating structure determination program 401. The storage unit 40 also stores the coating structure data 413 as information output after execution of the coating structure determination program 401. The storage unit 40 moreover stores the diffracted light intensity distribution 410, principal diffracted light 411, and a principal incident angle 412 as information temporarily stored during execution of the coating structure determination program 401.

The coating structure determination program 401 is a program for determining the structure (coating structure data 413) of an antireflection coating formed on a substrate as the exposure target of the exposure apparatus.

The pattern data 402 is data on a pattern (which is a resolution pattern formed on the substrate and is called a layout pattern or a target pattern) laid out in designing, for example, an integrated circuit. Note that the pattern is formed from closed figures and a set of these figures constitute the entire mask pattern.

The effective light source information 403 is information concerning polarization and a light intensity distribution (effective light source) formed on the pupil plane of the projection optical system when the projection optical system has none of aberration, birefringence, or transmission nonuniformity and no mask is located on the object plane of the projection optical system.

The NA information 404 is information concerning the numerical aperture (NA) of the projection optical system on its image plane side.

The λ information 405 is information concerning a wavelength λ of light (exposure light) emitted by the light source.

The aberration information 406 is information concerning the aberration of the projection optical system. When the projection optical system has birefringence, a phase shift naturally occurs depending on factors associated with the birefringence and can be included in the aberration of the projection optical system.

The immersion liquid information 407 is information concerning an immersion liquid used for an immersion exposure apparatus. The immersion liquid information 407 includes, for example, the type of immersion liquid (for example, ultra-pure water, pure water, functional water, or a fluorinated solution), and the complex refractive index of the immersion liquid.

The resist information 408 is information concerning a resist applied on the substrate.

The mask data 409 is data representing the pattern of a mask as the original. The mask data 409 includes main patterns corresponding to the target patterns to be formed on the substrate, and assist patterns. However, the mask data 409 may include only main patterns without any assist patterns.

The diffracted light intensity distribution 410 is generated during execution of the coating structure determination program 401, and represents the intensity distribution of light diffracted by the mask illuminated by the illumination optical system.

The principal diffracted light 411 is generated during execution of the coating structure determination program 401, and represents diffracted light beams which have intensities equal to or higher than a threshold and are extracted from the diffracted light intensity distribution 410 (i.e., diffracted light (to be referred to as "principal diffracted light" hereinafter) that mainly contributes to imaging).

The principal incident angle 412 is generated during execution of the coating structure determination program 401, and represents the incident angle (to be referred to as the "principal incident angle" hereinafter) of the principal diffracted light 411 on an antireflection coating formed on the substrate (or that incident angle on a resist applied on the substrate).

The coating structure data 413 is data representing the structure of an antireflection coating formed on the substrate, which is determined by executing the coating structure determination program 401. The coating structure data 413 includes, for example, the thickness, complex refractive index, and material of the antireflection coating.

The input unit 50 includes, for example, a keyboard and mouse. The user can input, for example, information associated with the coating structure determination program 401 via the input unit 50.

The medium interface 60 includes, for example, a flexible disk drive, CD-ROM drive, DVD-ROM drive, and USB interface and is configured to be connectable to the storage medium 70. Note that the storage medium 70 is, e.g., a flexible disk, a CD-ROM, a DVD-ROM, or a USB memory and provides the coating structure determination program 401 and other programs executed by the processing apparatus 1.

A process of determining the coating structure data 413 by executing the coating structure determination program 401 by the control unit 20 of the processing apparatus 1 will be explained below with reference to FIG. 2. The coating structure determination program 401 optimizes the structure of the antireflection coating for diffracted light beams having intensities equal to or higher than a threshold (principal diffracted light) of light diffracted by the mask illuminated by the illumination optical system.

In step S202, the control unit 20 determines input information including the pattern data 402, effective light source information 403, NA information 404, λ information 405, aberration information 406, immersion liquid information 407, resist information 408, and mask data 409. The user selects, for example, effective light source information "Hexapole Illumination", NA information "1.35", λ information "193 nm", and mask data "Contact Hole+Assist Pattern", which are stored in the storage unit 40 in advance, via the input unit 50. In accordance with the coating structure determination program 401, the control unit 20 displays the input information selected by the user on the display unit 30, and determines the input information. However, the user may input information, associated with the coating structure determination program 401, which is not stored in the storage unit 40.

In this embodiment, not only main patterns corresponding to the target patterns but also assist patterns are assumed to be set (inserted) in the mask data 409, determined in step S202, by taking account of the projection magnification of the projection optical system. As will be described later, the use of the mask data 409 obtained by inserting assist patterns into main patterns makes it possible to easily extract the principal diffracted light 411 from the diffracted light intensity distribution 410 (i.e., to easily narrow down the principal diffracted light 411).

Assist patterns can be set using, for example, the 2D-TCC method disclosed in Japanese Patent Laid-Open No. 2008-040470 or the IML method disclosed in Japanese Patent Laid-Open No. 2004-221594. Assist patterns set by the 2D-TTC method will be explained herein. When, for example, the main patterns and target patterns of a mask are the same, the 2D-TCC method calculates approximate aerial images of the main patterns from the main patterns and the effective light source. Japanese Patent Laid-Open No. 2008-040470 discloses the mechanism of improving the imaging performance with respect to the effective light source by inserting assist patterns into positions corresponding to the positions at which the intensities are high in the approximate aerial images. Also, the 2D-TCC method calculates approximate aerial images using information of the main patterns (mask pattern) and a two-dimensional transmission cross coefficient based on a function describing the effective light source (information of the effective light source) and a pupil function describing the pupil of the projection optical system. Note that a two-dimensional transmission cross coefficient based on a function describing the effective light source and a pupil function is the computation result of a certain component of a transmission cross coefficient (TCC). Also, the 2D-TCC method can calculate the positions at which the intensities are high in the approximate aerial images by, for example, a Laplacian operation of the approximate aerial images. For this reason, the positions in which assist patterns are inserted are not always derived from the approximate aerial images themselves.

In step S204, the control unit 20 calculates, the intensity distribution of light diffracted by the mask illuminated by the illumination optical system (diffracted light intensity distribution 410), based on the input information determined in step S202.

In step S206, the control unit 20 extracts diffracted light beams having intensities equal to or higher than a threshold (principal diffracted light 411) from the diffracted light intensity distribution 410 calculated in step S204. The control unit 20 extracts, as the principal diffracted light 411, diffracted light beams having intensities of, for example, 20% or more of the maximum value of the intensity in the diffracted light intensity distribution 410.

In step S208, the control unit 20 calculates the incident angle (principal incident angle 412) of the principal diffracted light 411 extracted in step S206 on an antireflection coating formed on the substrate. The principal incident angle 412 can be calculated from the effective light source information 403 and diffracted light intensity distribution 410 by taking account of the birefringence of the immersion liquid, as will be described later.

In step S210, the control unit 20 determines the structure (coating structure data 413) of the antireflection coating such that its reflectance falls within a target range when the principal incident angle 412 calculated in step S208 is an input (i.e., such that its reflectance at the principal incident angle 412 is low). When, for example, the complex refractive index of the antireflection coating is determined, the reflectances of the antireflection coating (i.e., the reflectances corresponding to respective thicknesses of the antireflection coating) are calculated while changing the thickness of the antireflection coating, and the coating thickness at which the reflectance is minimum is determined. At this time, the reflectance of the antireflection coating is calculated at only the principal incident angle 412 calculated in step S208.

In this manner, in this embodiment, the structure of an antireflection coating is optimized by taking account of the principal incident angle to determine a coating structure which has a low reflectance for principal diffracted light (diffracted light that mainly contributes to imaging). Hence, an antireflection coating having the structure determined in this embodiment has a reflectance for principal diffracted light which is lower than that of an antireflection coating designed so as to have low reflectances over the entire incident angle range determined by the NA of the projection optical system. In other words, in this embodiment, a coating structure which suppresses degradation in imaging performance can be determined in designing an antireflection coating formed on the substrate. In addition, in this embodiment, since the reflectance at only the principal incident angle is calculated, a computation load can be reduced as compared with the conventional technique of calculating the reflectances over the entire incident angle range determined by the NA of the projection optical system. However, the structure of an antireflection coating may be determined such that its reflectance falls within a target range when the incident angle of diffracted light in the diffracted light intensity distribution on the antireflection coating is an input, without extracting principal diffracted light.

A process of determining a coating structure (coating structure data) by executing a coating structure determination program, and the coating structure determined by this process will be explained in the first to third embodiments.

The first to third embodiments will exemplify a case in which a positive resist is applied on a substrate and patterns are formed in portions having light intensities equal to or higher than a predetermined threshold. However, the present invention is also applicable to a case in which a negative resist is applied on a substrate and patterns are formed in portions having light intensities equal to or lower than a predetermined threshold, as a matter of course.

<First Embodiment>

In the first embodiment, the structure of an antireflection coating is optimized by determining the thickness of the antireflection coating such that its reflectance at the principal incident angle is low. Note that the reflectance and absorption coefficient of the antireflection coating are assumed to be determined in advance.

The first embodiment will exemplify a case in which the structure of a single-layered antireflection coating formed between a substrate and a resist is determined, as shown in FIG. 3. FIG. 3 is a schematic sectional view showing the positional relationship among an antireflection coating, a resist, and a substrate.

Also, the first embodiment assumes an immersion exposure apparatus which includes a projection optical system having an NA of 1.35, uses exposure light having a wavelength of 193 nm, and uses water (refractive index n=1.44) as the immersion liquid. The projection optical system is assumed to have no aberration and a projection magnification of 0.25×. The resist is assumed to have a thickness of 115 nm and a complex refractive index of 1.710. The antireflection coating is assumed to be single-layered and have a complex refractive index of 1.700. The substrate is assumed to be silicon (complex refractive index=0.910).

Figure 4:
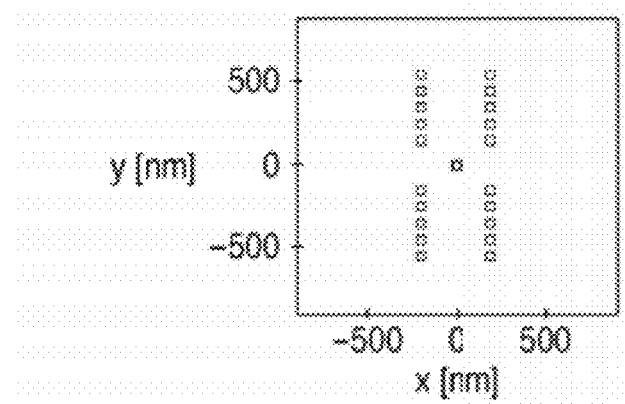
FIG. 4 is a view showing contact hole patterns as an example of the target patterns (pattern data).
Figure 5:
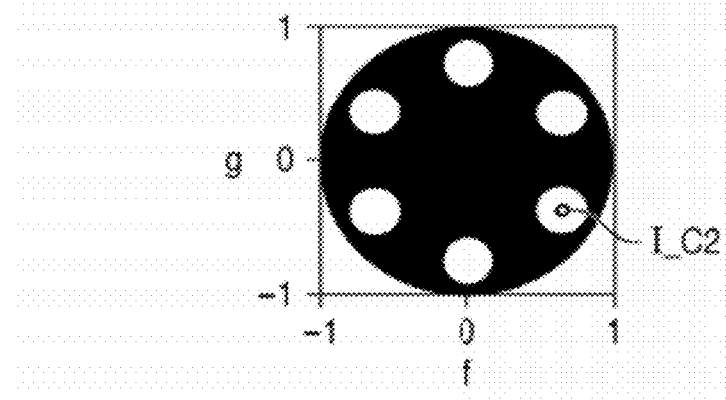
FIG. 5 is a view showing hexapole illumination as an example of the effective light source.

The target patterns (pattern data) are assumed to be square contact hole patterns each with a side length of 50 nm on the scale of the image plane, as shown in FIG. 4. The effective light source is assumed to be hexapole illumination having a center σ of 0.716, a radius of 0.150, and no polarization, as shown in FIG. 5. In FIG. 5, six white regions indicate the light irradiation portions.

Figure 6:
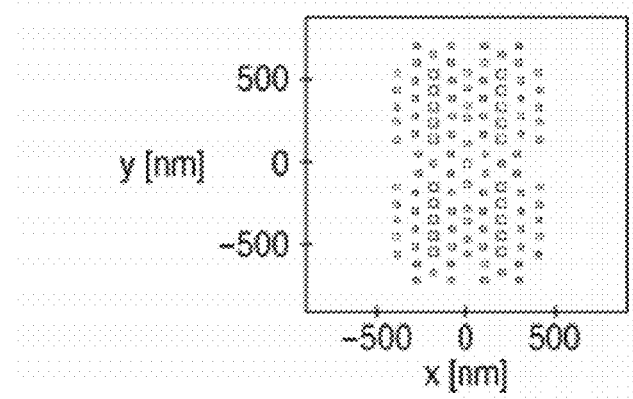
FIG. 6 is a view showing a mask pattern (mask data) in which assist patterns are set using the 2D-TCC method from the target patterns shown in FIG. 4 and the effective light source shown in FIG. 5.

FIG. 6 shows a mask pattern (mask data) in which assist patterns are set using the 2D-TCC method from the target patterns shown in FIG. 4 and the effective light source shown in FIG. 5. FIG. 6 shows the mask pattern on the scale of the image plane. Main patterns included in the mask pattern are the same as the target patterns and therefore are square contact hole patterns each with a side length of 50 nm on the scale of the image plane. Although the sizes of the main patterns are assumed to be the same herein, they may vary if the respective patterns produce exposure results with different sizes. The present invention is also applicable to a case in which the sizes of the main patterns vary, as a matter of course. Also, assist patterns are assumed to be square patterns each with a side length of 30 nm on the scale of the image plane.

Figure 7:
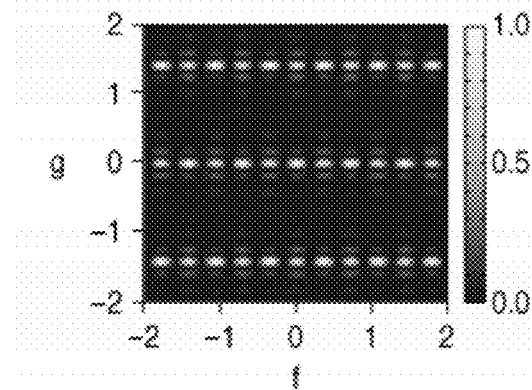
FIG. 7 is a chart showing the intensity distribution of light diffracted by a mask (diffracted light intensity distribution), which is calculated from the target patterns shown in FIG. 4 and the effective light source shown in FIG. 5.

Calculation of the intensity distribution of light diffracted by the mask (diffracted light intensity distribution) based on the target patterns shown in FIG. 4 and the effective light source shown in FIG. 5 yields a diffracted light intensity distribution shown in FIG. 7. The diffracted light intensity distribution shown in FIG. 7 is normalized by the maximum value of the intensity of the diffracted light. Also, an abscissa f and ordinate g in FIG. 7 are normalized by the NA of the projection optical system.

Figure 8:
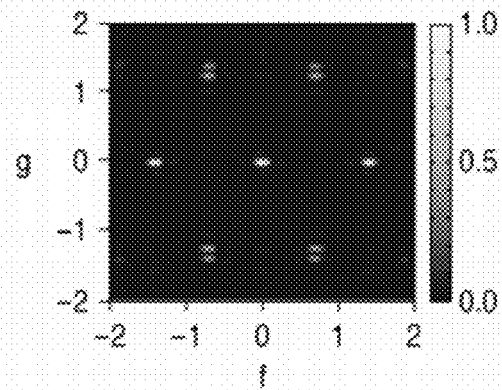
FIG. 8 is a chart showing the intensity distribution of light diffracted by a mask (diffracted light intensity distribution), which is calculated from the mask pattern shown in FIG. 6 and the effective light source shown in FIG. 5.

Calculation of the intensity distribution of light diffracted by the mask (diffracted light intensity distribution) based on the mask pattern shown in FIG. 6 and the effective light source shown in FIG. 5 yields a diffracted light intensity distribution shown in FIG. 8. The diffracted light intensity distribution shown in FIG. 8 is normalized by the maximum value of the intensity of the diffracted light. Also, an abscissa f and ordinate g in FIG. 8 are normalized by the NA of the projection optical system.

Figure 9:
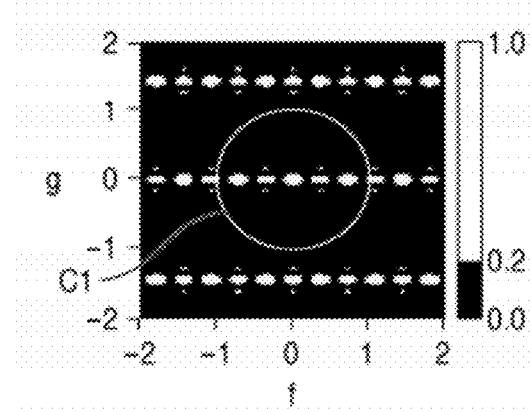
FIG. 9 is a chart showing the result of extracting diffracted light beams having intensities of 0.2 or more from the diffracted light intensity distribution shown in FIG. 7.

Also, extraction of diffracted light beams having intensities of 0.2 or more (principal diffracted light) from the diffracted light intensity distribution shown in FIG. 7 yields diffracted light shown in FIG. 9. In FIG. 9, reference symbol C1 denotes the pupil range of the projection optical system for light which enters it perpendicularly. Similarly, extraction of diffracted light beams having intensities of 0.2 or more (principal diffracted light) from the diffracted light intensity distribution shown in FIG. 8 yields diffracted light shown in FIG. 10.

Figure 10:
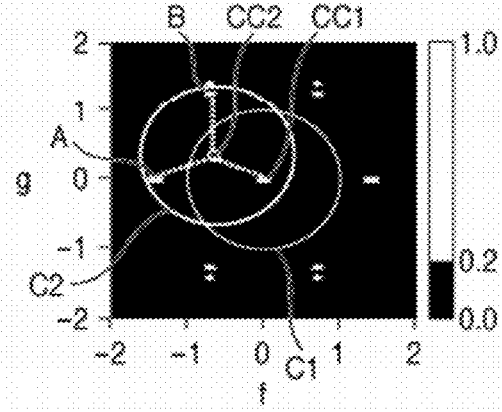
FIG. 10 is a chart showing the result of extracting diffracted light beams having intensities of 0.2 or more from the diffracted light intensity distribution shown in FIG. 8.

Referring to FIGS. 9 and 10, the use of a mask pattern including main patterns and assist patterns narrows down diffracted light beams having intensities of 0.2 or more. This makes it possible to easily extract the principal diffracted light from the diffracted light distribution.

A method of calculating the principal incident angle will be explained in detail below with reference to FIG. 10.

In FIG. 10, reference symbol CC1 denotes the center (central position) of the pupil range C1 of the projection optical system for light which enters it perpendicularly. Reference symbol C2 denotes a pupil defined by the NA of the projection optical system for light from a point source denoted by reference symbol I_C2 in FIG. 5. Reference symbol CC2 denotes the center (central position) of the pupil C2. The light from the point source I_C2 shown in FIG. 5 is diffracted by the mask pattern, and diffracted light beams which fall within the range of the pupil C2 shown in FIG. 10 interfere with each other and so contribute to imaging. Of such diffracted light that contributes to imaging, the diffracted light beams at three positions CC1, A, and B shown in FIG. 10 have especially high intensities (intensities of 0.2 or more). For this reason, the diffracted light beams at the positions CC1, A, and B are expected to have a great influence on the imaging performance.

Figure 11:
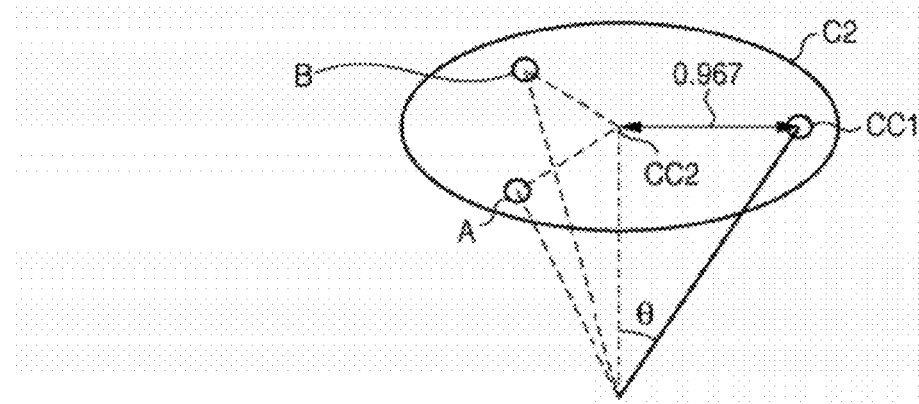
FIG. 11 is a diagram for explaining the principal incident angle.

The incident angle (principal incident angle) of the diffracted light beam at the position CC1 relative to the pupil C2 can be expressed by reference symbol θ shown in FIG. 11. Since the interval between the positions CC1 and CC2 is 0.716 in the pupil coordinate system shown in FIG. 10, and the NA of the projection optical system is 1.35, that interval is 0.716×1.35=0.966 for a pupil with a radius of 1.35.

The principal incident angle θ shown in FIG. 11 always satisfies n×sin θ=0.966 from the law of refraction (Snell's law). The incident angle of diffracted light on the antireflection coating is calculated as 34° from a resist refractive index n=1.710. Since the interval between the positions A and CC2 is 0.858 in the pupil coordinate system shown in FIG. 10, the incident angle of diffracted light on the antireflection coating is similarly calculated as 43°. Since the interval between the positions B and CC2 in the pupil coordinate system shown in FIG. 10 is 0.829, the incident angle of diffracted light on the antireflection coating is similarly calculated as 45°. Also, the intensity ratios of three diffracted light beams that mainly contribute to imaging are as follows. Assuming the intensity ratio of the diffracted light beam at the position CC1 as 1, that of the diffracted light beam at the position A is 0.92, and that of the diffracted light beam at the position B is 0.59.

The thickness of the antireflection coating is determined to specify its structure such that its reflectances for the diffracted light beams at the positions CC1, A, and B are low, that is, the sum of its reflectances for light beams having incident angles 34°, 43°, and 45° is small. The sum of the reflectances of the antireflection coating for light beams having incident angles of 34°, 43°, and 45° may be calculated as that weighted by the intensity ratios of the respective diffracted light beams. In this case, the thickness of the antireflection coating is determined such that its reflectance for the diffracted light beam which is present at the position CC1 and has a maximum intensity (i.e., for light having an incident angle of 34°) is low. In other words, in this embodiment, the principal incident angle is 34°.

FIGS. 12A and 12B are charts showing the reflectances of the antireflection coating when its thickness and the light incident angle on it are changed. FIG. 12A shows the reflectance (intensity reflectance) for a TE wave, and FIG. 12B shows the reflectance (intensity reflectance) for a TM wave. Note that the reflectances are calculated from Fresnel equations in the respective boundaries shown in FIG. 3.

Curves shown in FIGS. 12A and 12B each indicate that the reflectance is 0.02. Referring to FIGS. 12A and 12B, the thickness of the antireflection coating, at which its reflectance for light having an incident angle of 34° is low, is 110 nm. However, the thickness of the antireflection coating, at which its reflectance for principal diffracted light having the principal incident angle of 34° is minimum within a predetermined coating thickness range (0 nm to 150 nm in this embodiment), is determined as that used in practice.

To confirm whether a 110-nm thick antireflection coating can achieve good imaging performance, an antireflection coating having a thickness (95 nm) smaller than 110 nm and that having a thickness (150 nm) larger than 110 nm are used for the sake of comparison. Note that the 95-nm thick antireflection coating is set so as to have a low reflectance for light which enters it perpendicularly. Also, the 150-nm thick antireflection coating is set so as to have low reflectances over the entire incident angle range of 0° to 52°. Note that 52° is a maximum incident angle beyond which a projection optical system having a numerical aperture of 1.35 can no longer receive light.

FIGS. 13A to 13F are views showing the imaging performances when the antireflection coating has a thickness of 95 nm, 110 nm, or 150 nm. The contours of the hole patterns shown in FIGS. 13A, 13C, and 13E are drawn at the slice level, at which the hole diameter is 50 nm at the position y=0 nm and z=57 nm of an isolated hole pattern at the origin in the x-y plane, with a margin of ±5% of this slice level. In this case, the boundary between the resist and the antireflection coating is assumed to be located at z=0 nm. The contours of the hole patterns shown in FIGS. 13B, 13D, and 13F are sectional views taken along the x-z plane at y=0 nm, and are drawn at the slice level, at which the hole diameter is 50 nm at the position y=0 nm of the isolated hole pattern at the origin in the x-y plane, with a margin of ±5% of this slice level. In addition, FIGS. 13A and 13B show the contours of the hole patterns when the antireflection coating has a thickness of 95 nm. FIGS. 13C and 13D show the contours of the hole patterns when the antireflection coating has a thickness of 110 nm. FIGS. 13E and 13F show the contours of the hole patterns when the antireflection coating has a thickness of 150 nm.

When the antireflection coating has a thickness of 95 nm, the target patterns are resolved, as shown in FIG. 13A, but the intensity distribution in the z direction inside the resist has low uniformity to the degree that a large constriction is present around z=40 nm, as shown in FIG. 13B.

When the antireflection coating has a thickness of 110 nm, the target patterns are resolved, as shown in FIG. 13C, and so the intensity distribution in the z direction inside the resist has high uniformity, as shown in FIG. 13D.

When the antireflection coating has a thickness of 150 nm, the target patterns are resolved, as shown in FIG. 13E, but the intensity distribution in the z direction inside the resist has low uniformity to the degree that a large constriction is present around z=50 nm, as shown in FIG. 13F.

Although the respective holes have different sizes at all the coating thicknesses, these differences can be corrected by adjusting the sizes of the main patterns, as described above. In contrast, the uniformities in the z direction cannot be corrected even by adjusting the sizes of the main patterns.

In this manner, a 110-nm thick antireflection coating achieves an imaging performance higher than those achieved by a 95- or 150-nm thick antireflection coating.

<Second Embodiment>

In the second embodiment, the structure of an antireflection coating is optimized by determining the complex refractive index (material) of the antireflection coating such that its reflectance at the principal incident angle is low. Note that the thickness of the antireflection coating is assumed to be determined in advance.

In the second embodiment, the NA of a projection optical system, the wavelength of exposure light, an immersion liquid, the thickness of a resist, the complex refractive index of the resist, a substrate, the target patterns, the effective light source, and a mask pattern, for example, are assumed to be the same as in the first embodiment. The antireflection coating is assumed to be single-layered and have a thickness of 110 nm.

Since the same effective light source and mask pattern as in the first embodiment are used in the second embodiment, the principal incident angle is 34° as in the first embodiment. For this reason, the complex refractive index of the antireflection coating need only be determined such that its reflectance for light having an incident angle of 34° is minimum. Note that a refractive index n of the antireflection coating can be changed within the range of 1.50 to 1.80, and an absorption coefficient k of the antireflection coating can be changed within the range of 0.00 to 0.20.

FIGS. 14A and 14B are charts showing the reflectances of the antireflection coating when its refractive index n (absorption coefficient k) is changed. FIG. 14A shows the reflectance (intensity reflectance) for a TE wave, and FIG. 14B shows the reflectance (intensity reflectance) for a TM wave.

Curves shown in FIGS. 14A and 14B each indicate a complex refractive index n when the reflectance is 0.02. Referring to FIGS. 14A and 14B, the refractive index n (absorption coefficient k) of the antireflection coating, at which its reflectance for light having an incident angle of 34° is low, is n=1.700 (k=1.80). However, the complex refractive index n of the antireflection coating, at which its reflectances for TE and TM waves are lower than predetermined values (for example, its reflectances for TE and TM waves are lower than 0.02), may be determined as that used in practice. Alternatively, the complex refractive index of an existing material, which is close to that of the antireflection coating and at which its reflectance for light having an incident angle of 34° is minimum, may be determined as that of the antireflection coating used in practice.

The imaging performance when the refractive index n (absorption coefficient k) of the antireflection coating is n=1.700 (k=1.80) is the same as that shown in FIGS. 13C and 13D.

In this manner, the optimization condition of the structure of an antireflection coating is not limited to its thickness, and its complex refractive index (material) may also be used for the optimization.

<Third Embodiment>

The third embodiment will exemplify a case in which the structure of a double-layered antireflection coating formed between a substrate and a resist is determined, as shown in FIG. 15. FIG. 15 is a schematic sectional view showing the positional relationship among an antireflection coating, a resist, and a substrate.

In the second embodiment, the NA of a projection optical system, the wavelength of exposure light, an immersion liquid, the thickness of a resist, the complex refractive index of the resist, a substrate, the target patterns, the effective light source, and a mask pattern, for example, are assumed to be the same as in the first embodiment. Of the double-layered antireflection coating, a first antireflection coating on the resist side is assumed to have a thickness of 50 nm, a refractive index n of 1.700, and an absorption coefficient k of 0.180. Also, of the double-layered antireflection coating, a second antireflection coating on the substrate side is assumed to have an absorption coefficient k of 0.180.

In the third embodiment, the structure of an antireflection coating is optimized by determining the thickness and complex refractive index of the second antireflection coating such that its reflectance at the principal incident angle is low. Since the same effective light source and mask pattern as in the first embodiment are used in the third embodiment, the incident angles of diffracted light beams that mainly contribute to imaging are 34°, 43°, and 45°. In this case, the principal incident angle is assumed to be 43°. Note that a complex refractive index n of the second antireflection coating can be changed within the range of 1.50 to 1.80, and the thickness of the second antireflection coating can be changed within the range of 40 nm to 100 nm.

Figure 16A:
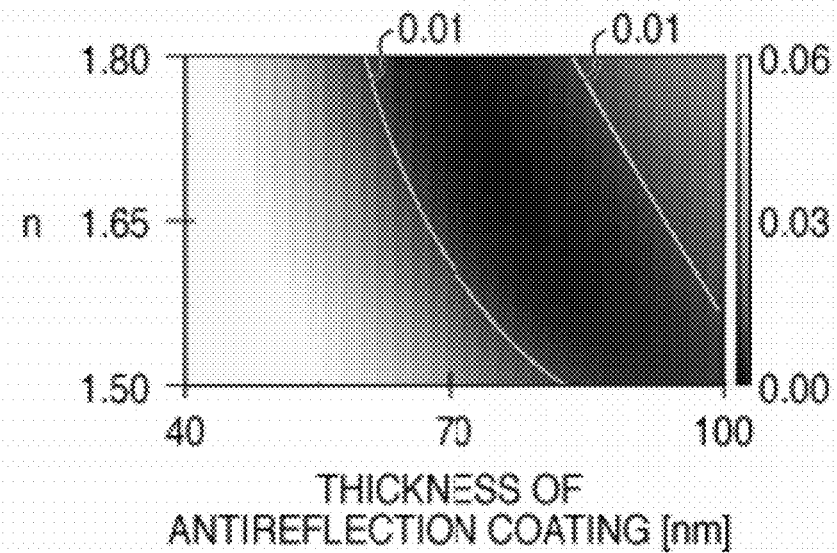
FIGS. 16A and 16B are charts showing the reflectances of the antireflection coating for light having an incident angle of 43°.
Figure 16B:
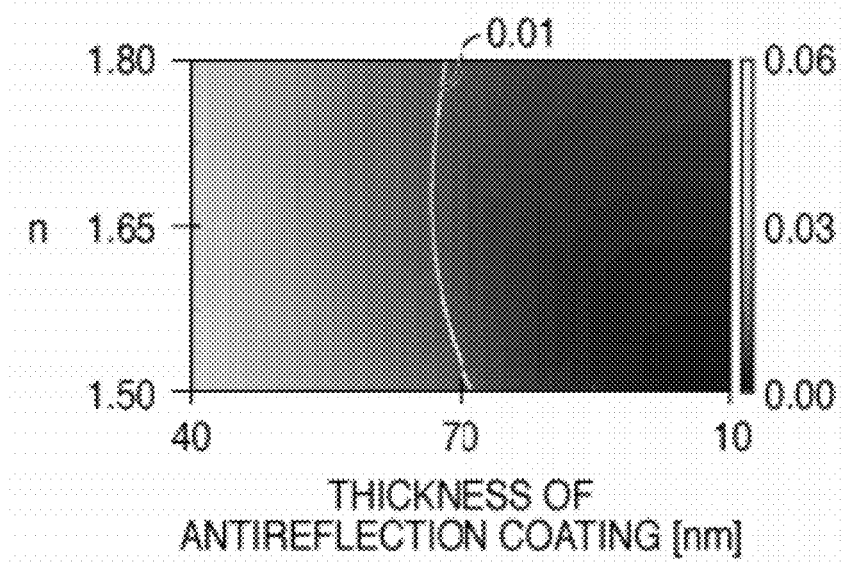

FIGS. 16A and 16B are charts showing the reflectances of the antireflection coating for light having an incident angle of 43°. FIG. 16A shows the reflectance (intensity reflectance) for a TE wave, and FIG. 16B shows the reflectance (intensity reflectance) for a TM wave.

Curves shown in FIGS. 16A and 16B each describe a reflectance of 0.01. Referring to FIGS. 16A and 16B, a coating structure in which the sum of the reflectances for TE and TM waves is minimum has a complex refractive index n of 1.67 and a thickness of 78 nm. At this time, the reflectance for a TE wave is 0.0001, and that for a TM wave is 0.0056.

For the sake of comparison, note that the single-layered antireflection coating in the first embodiment has a reflectance of 0.0174 for a TE wave and a reflectance of 0.0139 for a TM wave. These reflectances correspond to a coating structure having a complex refractive index n of 1.70 and a thickness of 60 nm in FIGS. 16A and 16B.

In this manner, the structure of an antireflection coating can be determined at the principal incident angle in designing a double-layered antireflection coating as well.

Figure 17:
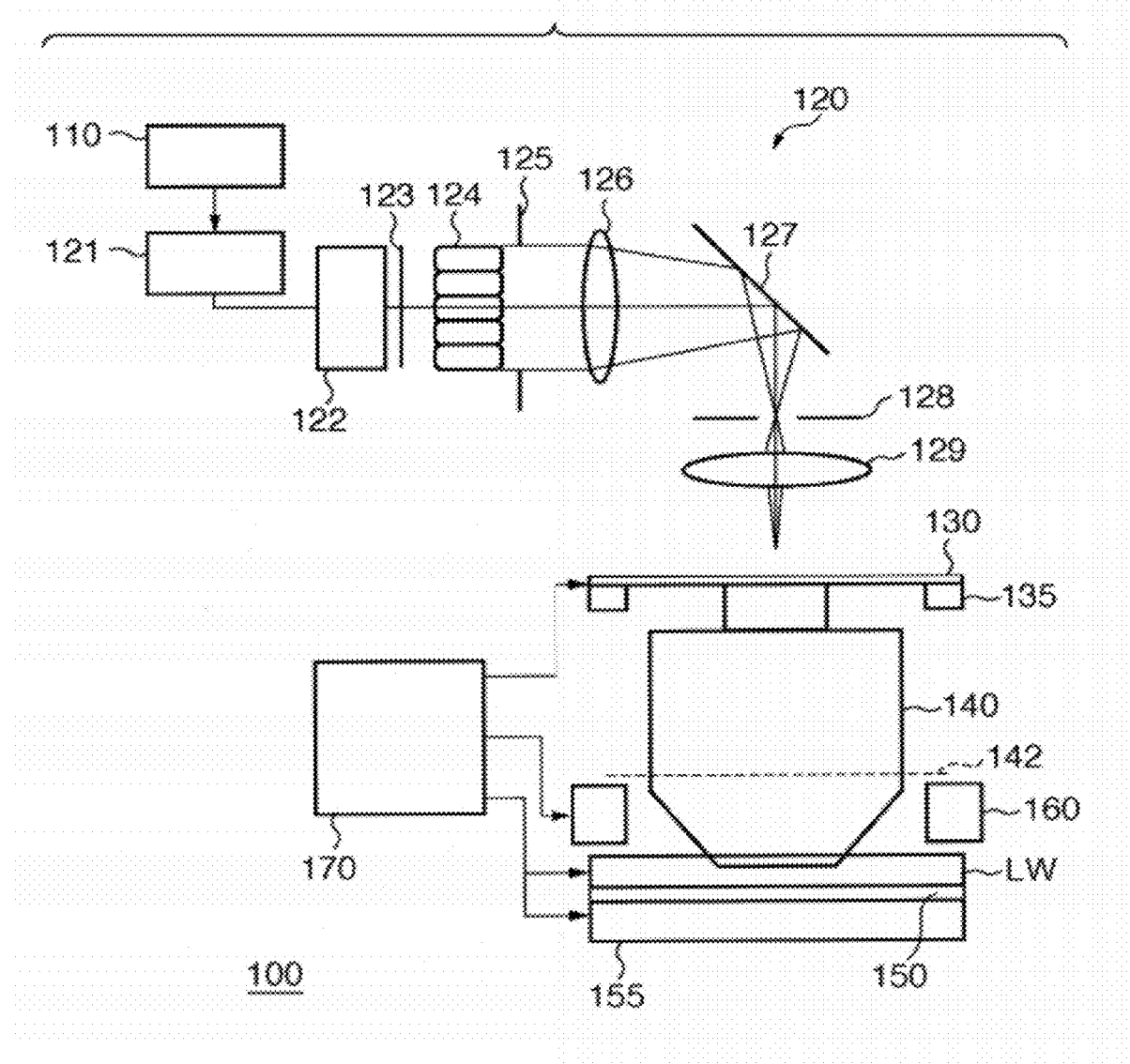
FIG. 17 is a schematic block diagram showing the arrangement of an exposure apparatus.

An exposure apparatus 100 will be explained next with reference to FIG. 17. FIG. 17 is a schematic block diagram showing the arrangement of the exposure apparatus 100. The exposure apparatus 100 exposes a wafer 150 on which an antireflection coating having a structure determined by the coating structure determination program according to this embodiment is formed.

The exposure apparatus 100 is an immersion exposure apparatus which transfers the pattern of a mask 130 onto the wafer 150 by exposure via a liquid LW supplied between the wafer 150 and a projection optical system 140. Although the exposure apparatus 100 is of the step & scan scheme in this embodiment, it can also adopt the step & repeat scheme or another exposure scheme.

As shown in FIG. 17, the exposure apparatus 100 includes an illumination optical system 120, a mask stage 135 which mounts the mask 130, the projection optical system 140, a wafer stage 155 which mounts the wafer 150, a liquid supply/recovery unit 160, and a main control system 170. A light source 110 and the illumination optical system 120 constitute an illumination apparatus which illuminates the mask 130 on which a circuit pattern to be transferred is formed.

The light source 110 is an excimer laser such as a KrF excimer laser having a wavelength of about 248 nm or an ArF excimer laser having a wavelength of about 193 nm. However, the type and number of light sources 110 are not limited, and the light source 110 can also be, for example, an $F_2$ laser having a wavelength of about 157 nm.

The illumination optical system 120 illuminates the mask 130 with light from the light source 110. The illumination optical system 120 can exploit various kinds of illumination modes such as the conventional illumination and modified illumination (for example, quadrupole illumination). In this embodiment, the illumination optical system 120 includes a beam shaping optical system 121, condensing optical system 122, polarization control unit 123, optical integrator 124, and aperture stop 125. The illumination optical system 120 also includes a condenser lens 126, deflecting mirror 127, masking blade 128, and imaging lens 129.

The beam shaping optical system 121 is, for example, a beam expander including a plurality of cylindrical lenses. The beam shaping optical system 121 changes the aspect ratio of the cross-sectional shape of collimated light from the light source 110 to a predetermined value (for example, it converts the cross-sectional shape from a rectangle to a square). In this embodiment, the beam shaping optical system 121 shapes light from the light source 110 into one having a size and an angle of divergence required to illuminate the optical integrator 124.

The condensing optical system 122 includes a plurality of optical elements and efficiently guides the light shaped by the beam shaping optical system 121 to the optical integrator 124. The condensing optical system 122 includes, for example, a zoom lens system and adjusts the shape and angular distribution of light which enters the optical integrator 124.

The polarization control unit 123 includes, for example, a polarizer and is placed at a position nearly conjugate to a pupil plane 142 of the projection optical system 140. The polarization control unit 123 controls the polarization state, in a predetermined region, of an effective light source formed on the pupil plane 142 of the projection optical system 140.

The optical integrator 124 has a function of uniforming light which illuminates the mask 130, converting the angular distribution of the incident light into its positional distribution, and outputting the resultant light. The optical integrator 124 is, for example, a fly-eye lens having its incident surface and exit surface which hold the Fourier transform relationship. The fly-eye lens is configured by combining a plurality of rod lenses (i.e., microlens elements). However, the optical integrator 124 is not limited to a fly-eye lens, and it may be, for example, an optical rod, a diffraction grating, or a cylindrical lens array plate including lens pairs arranged perpendicularly.

The aperture stop 125 is located at a position that is immediately after the exit surface of the optical integrator 124 and nearly conjugate to an effective light source formed on the pupil plane 142 of the projection optical system 140. The aperture shape of the aperture stop 125 corresponds to the light intensity distribution (i.e., the effective light source shape) of an effective light source formed on the pupil plane 142 of the projection optical system 140. In other words, the aperture stop 125 controls the light intensity distribution of the effective light source. The aperture stop 125 is configured to be switchable in accordance with the illumination mode. Without or together with an aperture stop, the effective light source shape may be adjusted by locating a diffractive optical element (CGH) or a prism on the light source side of the optical integrator 124.

The condenser lens 126 converges the light which comes from secondary light sources formed near the exit surface of the optical integrator 124 and which has passed through the aperture stop 125, and uniformly illuminates the masking blade 128 with the converged light via the deflecting mirror 127.

The masking blade 128 is placed at a position nearly conjugate to the mask 130 and includes a plurality of movable light-shielding plates. The masking blade 128 forms an aperture with a nearly rectangular shape corresponding to the effective area of the projection optical system 140. The light having passed through the masking blade 128 is used as light which illuminates the mask 130.

The imaging lens 129 guides the light having passed through the aperture in the masking blade 128 to form an image on the mask 130.

The mask 130 has a circuit pattern to be transferred (main patterns) and assist patterns. The mask 130 is supported and driven by the mask stage 135. Diffracted light generated by the mask 130 is projected onto the wafer 150 via the projection optical system 140. The mask 130 and wafer 150 are positioned in an optically conjugate relationship. Since the exposure apparatus 100 is of the step & scan scheme, it transfers the circuit pattern to be transferred on the mask 130 onto the wafer 150 by synchronously scanning them. When the exposure apparatus 100 is of the step & repeat scheme, it exposes the wafer 150 while the mask 130 and wafer 150 stand still.

The mask stage 135 supports the mask 130 through a mask chuck and is connected to a driving mechanism (not shown). The driving mechanism (not shown) includes, for example, a linear motor and drives the mask stage 135 in the X-, Y-, and Z-axis directions and the rotation directions about the respective axes. Note that the scanning direction of the mask 130 or wafer 150 in its plane is defined as the Y-axis, a direction perpendicular to the scanning direction is defined as the X-axis, and a direction perpendicular to the plane of the mask 130 or wafer 150 is defined as the Z-axis.

The projection optical system 140 projects the circuit pattern of the mask 130 onto the wafer 150. The projection optical system 140 can be a dioptric system, a catadioptric system, or a catoptric system. The final lens (final surface) of the projection optical system 140 is coated with a coating for reducing (protecting the final lens against) the adverse effect of the liquid LW supplied from the liquid supply/recovery unit 160.

The circuit pattern of the mask 130 is projected (transferred) onto the wafer 150. An antireflection coating having a structure determined by the coating structure determination program according to this embodiment is formed on the wafer 150, as described above, and a resist is applied on the wafer 150 as well.

The wafer stage 155 supports the wafer 150 and moves it in the X-, Y-, and Z-axis directions and the rotation directions about the respective axes using a linear motor, as in the mask stage 135.

The liquid supply/recovery unit 160 has a function of supplying the liquid LW to the space between the wafer 150 and the final lens (final surface) of the projection optical system 140. The liquid supply/recovery unit 160 also has a function of recovering the liquid LW supplied to the space between the wafer 150 and the final lens of the projection optical system 140. A substance which has a high transmittance for exposure light, never makes dirt adhere onto the projection optical system 140 (its final lens), and matches the resist process is selected as the liquid LW.

The main control system 170 includes a CPU and memory and controls the operation of the exposure apparatus 100. The main control system 170 electrically connects to, for example, the mask stage 135, wafer stage 155, and liquid supply/recovery unit 160 and controls synchronous scanning between the mask stage 135 and the wafer stage 155. The main control system 170 also controls switching among the supply and recovery of the liquid LW and their stop based on, for example, the scanning direction and velocity of the wafer stage 155 during exposure.

In exposure, a light beam emitted by the light source 110 illuminates the mask 130 by the illumination optical system 120. The light beam which bears the information of the circuit pattern upon passing through the mask 130 forms an image on the wafer 150 via the liquid LW by the projection optical system 140. As described above, an antireflection coating having the structure determined by the coating structure determination program according to this embodiment is formed on the wafer 150 as the exposure target of the exposure apparatus 100. This makes it possible to reduce degradation in imaging performance attributed to the antireflection coating. Hence, the exposure apparatus 100 can provide high-quality devices (e.g., a semiconductor device, an LCD device, an image sensing device (e.g., a CCD), and a thin-film magnetic head) with a high throughput and a good economical efficiency. These devices are fabricated by a step of exposing a substrate (e.g., a wafer or glass plate) coated with a photoresist (photosensitive agent) using the exposure apparatus 100, a step of developing the exposed substrate, and other known steps).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-006896 filed on Jan. 15, 2009, which is hereby incorporated by reference herein in its entirety.

What is claimed is:

1. A storage medium storing a program for causing a computer to execute a method of determining a structure of an antireflection coating formed on a substrate as an exposure target of an exposure apparatus including an illumination optical system which illuminates an original with light from a light source and a projection optical system which projects a pattern of the original, the program causing the computer to execute steps of:
    calculating, an intensity distribution of light diffracted by the original illuminated by the illumination optical system, based on information of an effective light source formed on a pupil plane of the projection optical system when the original is not located on an object plane of the projection optical system, and information of an original pattern including a main pattern corresponding to a target pattern to be formed on the substrate and an assist pattern;
    extracting diffracted light having an intensity of not less than a threshold from the intensity distribution calculated in the calculating step; and
    determining the structure of the antireflection coating, formed on the substrate, such that a reflectance of the antireflection coating falls within a target range when an incident angle of the diffracted light, which has the intensity of not less than the threshold and is extracted in the extracting step, on the antireflection coating formed on the substrate is an input.

2. The storage medium according to claim 1, wherein
    the assist pattern is set based on an approximate aerial image formed on an image plane of the projection optical system, and
    the aerial image is calculated using the information of the original pattern and a two-dimensional transmission cross coefficient based on a function describing the information of the effective light source and a pupil function describing a pupil of the projection optical system.

3. The storage medium according to claim 1, wherein
    in the determining step, the thickness of the antireflection coating is determined to specify the structure of the antireflection coating formed on the substrate.

4. The storage medium according to claim 1, wherein
    in the determining step, a complex refractive index of the antireflection coating is determined to specify the structure of the antireflection coating formed on the substrate.

5. The storage medium according to claim 1, wherein
    in the determining step, a material of the antireflection coating is determined to specify the structure of the antireflection coating formed on the substrate.

6. A storage medium storing a program for causing a computer to execute a method of determining a structure of an antireflection coating formed on a substrate as an exposure target of an exposure apparatus including an illumination optical system which illuminates an original with light from a light source and a projection optical system which projects a pattern of the original, the program causing the computer to execute steps of:
    calculating, an intensity distribution of light diffracted by the original illuminated by the illumination optical system, based on information of an effective light source formed on a pupil plane of the projection optical system when the original is not located on an object plane of the projection optical system, and information of an original pattern; and
    determining the structure of the antireflection coating, formed on the substrate, such that a reflectance of the antireflection coating falls within a target range when an incident angle of the diffracted light in the intensity distribution calculated in the calculating step on the antireflection coating formed on the substrate is an input.

7. A method of determining a structure of an antireflection coating formed on a substrate as an exposure target of an exposure apparatus including an illumination optical system which illuminates an original with light from a light source and a projection optical system which projects a pattern of the original, the method comprising steps of:
    calculating, an intensity distribution of light diffracted by the original illuminated by the illumination optical system, based on information of an effective light source formed on a pupil plane of the projection optical system when the original is not located on an object plane of the projection optical system, and information of an original pattern including a main pattern corresponding to a target pattern to be formed on the substrate and an assist pattern;
    extracting diffracted light having an intensity of not less than a threshold from the intensity distribution calculated in the calculating step; and
    determining the structure of the antireflection coating, formed on the substrate, such that a reflectance of the antireflection coating falls within a target range when an incident angle of the diffracted light, which has the intensity of not less than the threshold and is extracted in the extracting step, on the antireflection coating formed on the substrate is an input.

8. A method of determining a structure of an antireflection coating formed on a substrate as an exposure target of an exposure apparatus including an illumination optical system which illuminates an original with light from a light source and a projection optical system which projects a pattern of the original, the method comprising steps of:
    calculating, an intensity distribution of light diffracted by the original illuminated by the illumination optical system, based on information of an effective light source formed on a pupil plane of the projection optical system when the original is not located on an object plane of the projection optical system, and information of an original pattern; and
    determining the structure of the antireflection coating, formed on the substrate, such that a reflectance of the antireflection coating falls within a target range when an incident angle of the diffracted light in the intensity distribution calculated in the calculating step on the antireflection coating formed on the substrate is an input.

9. An exposure method comprising steps of:
    determining a structure of an antireflection coating formed on a substrate using the method according to claim 7; and
    exposing the substrate on which the antireflection coating having the structure determined in the determining step is formed.

10. An exposure method comprising steps of:
    determining a structure of an antireflection coating formed on a substrate using the method according to claim 8; and exposing the substrate on which the antireflection coating having the structure determined in the determining step is formed.

11. A device fabrication method comprising steps of:
exposing a substrate using an exposure method according to claim 9; and
performing a development process for the substrate exposed.

12. A device fabrication method comprising steps of:
exposing a substrate using an exposure method according to claim 10; and
performing a development process for the substrate exposed.

* * * * *